(12) United States Patent
Smolen (10) Patent No.: US 6,365,929 B2
(45) Date of Patent: *Apr. 2, 2002

(54) SCALABLE TUNNEL OXIDE WINDOW WITH NO ISOLATION EDGES

(75) Inventor: Richard G. Smolen, Redwood City, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,198

(22) Filed: Jan. 22, 1999

Related U.S. Application Data

(62) Division of application No. 08/810,642, filed on Mar. 3, 1997, now Pat. No. 5,904,524.
(60) Provisional application No. 60/023,725, filed on Aug. 8, 1996.

(51) Int. Cl.$^7$ .............................................. H01L 29/788
(52) U.S. Cl. ........................ 257/315; 257/316; 257/317; 257/318; 257/365; 365/185.26; 438/257; 438/258; 438/259; 438/260; 438/261; 438/262
(58) Field of Search ................................. 257/315, 320, 257/321, 318; 438/266, 201, 202, 211, 257, 263, 264, 594

(56) References Cited

U.S. PATENT DOCUMENTS

| | | | |
|---|---|---|---|
| 4,699,690 A | 10/1987 | Arakawa | 438/264 |
| 4,822,750 A | 4/1989 | Perlegos et al. | 438/264 |
| 5,108,939 A | 4/1992 | Manley et al. | 438/264 |
| 5,132,239 A | 7/1992 | Ghezzi et al. | 437/43 |
| 5,225,362 A | 7/1993 | Bergemont | 437/43 |
| 5,293,331 A | 3/1994 | Hart et al. | 365/185 |
| 5,379,253 A | 1/1995 | Bergemont | 365/185 |
| 5,404,037 A | * 4/1995 | Manley | 257/321 |
| 5,411,904 A | 5/1995 | Yamauchi et al. | 437/43 |
| 5,412,238 A | 5/1995 | Chang | 257/321 |
| 5,480,821 A | 1/1996 | Chang | 437/43 |
| 5,501,996 A | 3/1996 | Yang et al. | 437/43 |
| 5,521,110 A | 5/1996 | Gill | 437/43 |

OTHER PUBLICATIONS

Altera Corporation, EPM7032 Reliability Information Package, (date unknown), pp. 1–26.

* cited by examiner

*Primary Examiner*—Olik Chaudhuri
*Assistant Examiner*—Wai-Sing Louie
(74) *Attorney, Agent, or Firm*—Beyer Weaver & Thomas LLP (57) ABSTRACT

Disclosed is an EEPROM device, and a method of making such a device, which incorporates a self-aligned tunnel window having acceptably low gate capacitance at the tunnel oxide node, and which avoids the defects caused by field oxide induced stresses in the tunnel oxide. The EEPROM of the present invention includes a semiconductor substrate with a doped memory diffusion region. Overlying at least a portion of the memory diffusion is a tunnel oxide. Overlying at least a portion of the tunnel oxide is a floating gate structure including an extension. The tunnel window of the EEPROM of the present invention is defined within at least a portion of the tunnel oxide and having at least two edges defined by the floating gate extension, so that when a defined voltage is applied to the memory diffusion a tunnel current sufficient to change the state of the EEPROM flows between the memory diffusion and the floating gate structure.

5 Claims, 8 Drawing Sheets

SCALABLE TUNNEL OXIDE WINDOW WITH NO ISOLATION EDGES

This is a Divisional application of prior application Ser. No. 08/810,642 filed on Mar. 3, 1997 now U.S. Pat. No. 5,904,524, designated the United States, the disclosure of which is incorporated herein by reference.

This application claims the benefit of the filing date of Provisional Application Serial No. 60/023,725, filed Aug. 8, 1996.

BACKGROUND OF THE INVENTION

The present invention relates generally to electrically erasable/programmable read only memories ("EEPROMs") and methods for their fabrication. More specifically, the invention relates to improved tunnel oxide windows on EEPROMs and methods of their fabrication.

Figure 1:
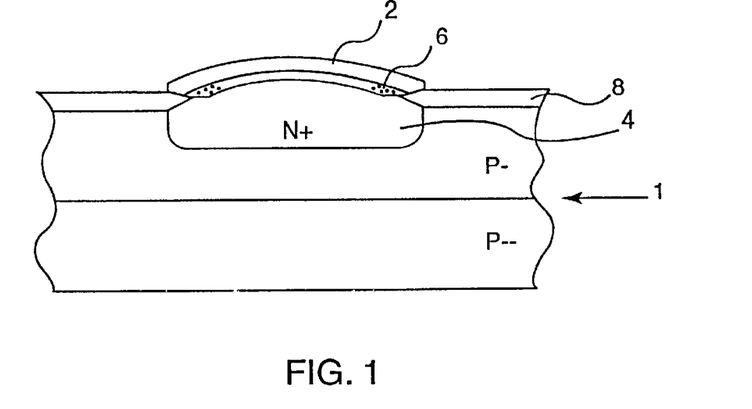
FIG. 1 is a cross-sectional schematic view of the tunnel oxide node of a basic EEPROM device, including defects.

As the name implies, electrically erasable/programmable devices can be both erased and programmed electrically without the need for exposure to ultraviolet light or other external factors. This has many advantages, of which the most obvious is the ability to erase or program EEPROM devices in window-less packages (unlike EPROM devices). FIG. 1 depicts a basic two electrode EEPROM structure employed to control programming and erasing. A floating gate 2 forms one electrode and a heavily doped n-type silicon memory diffusion 4 within the silicon substrate 1 forms the other. These two electrodes are separated by a tunnel oxide 6 of 80 Å in thickness, for example. A thick field oxide 8 of approximately 5000 Å in thickness, for example, exists on either edge of the tunnel oxide 6 in order to isolate this device from other devices on the chip.

The EEPROM cell is programmed (turned "off") or erased (turned "on") by charging or discharging, respectively, the floating gate 2. Charge is moved on or off the floating gate 2 by tunneling electrons between the floating gate 2 and a heavily doped memory diffusion 4 in the semiconductor substrate 1. When high voltages are applied to the highly doped diffusion 4 or the floating gate 2, electrons tunnel through tunnel oxide 6 separating the memory diffusion 4 from the floating gate 2. In the EEPROM's "off" state, the floating gate 2 is charged negatively to provide a very high threshold voltage which effectively prevents mobile charge carriers from flowing in a channel region of a read transistor (not shown) having as its gate electrode the floating gate 2. In the "on" state, the positively charged floating gate 2 provides a negative threshold voltage, allowing charge carriers to flow freely in the channel region.

Key to the programming and erasing processes is the tunnel oxide, or more precisely, that portion of the tunnel oxide through which electrons flow—sometimes referred to as a tunnel window. Under normal conditions, the tunnel oxide acts as a dielectric and does not conduct electricity. However, under high electric fields of, for example, 8 to 13 volts across the oxide, electron tunneling occurs through this oxide by a process known as Fowler-Nordheim tunneling. If the tunnel window contains defects (e.g., vacancies, charge trapping centers and dangling bonds), it may allow electrons to leak from a charged floating gate such that the EEPROM rapidly becomes inadvertently erased. The defects provide intermediate energy states allowing the electrons to tunnel more easily across the tunnel window. EEPROM devices having such defects are, of course, unacceptable.

Defects commonly result at the interface of a field oxide region and the tunnel oxide. The thick field oxide introduces severe stress in the materials proximate its "bird beak" protrusion. These stresses in turn can create defects in those portions of the tunnel window abutting the field oxide. The locus of this problem is illustrated in FIG. 1 (depicted as black dots) near the field oxide 8. In a related problem, when two field oxide regions come into close proximity (e.g., less than 0.8 μm separation), their combined stresses may bow the substrate surface together with the overlying tunnel oxide as shown, in an exaggerated fashion, in FIG. 1. This bowing may in its own right introduce defects into the tunnel oxide. While such a bowing may not be evident in relatively large devices, as EEPROMs scale to smaller dimensions (having for example tunnel windows of 0.5×0.5 μm) it can become a major concern.

Figure 2A:
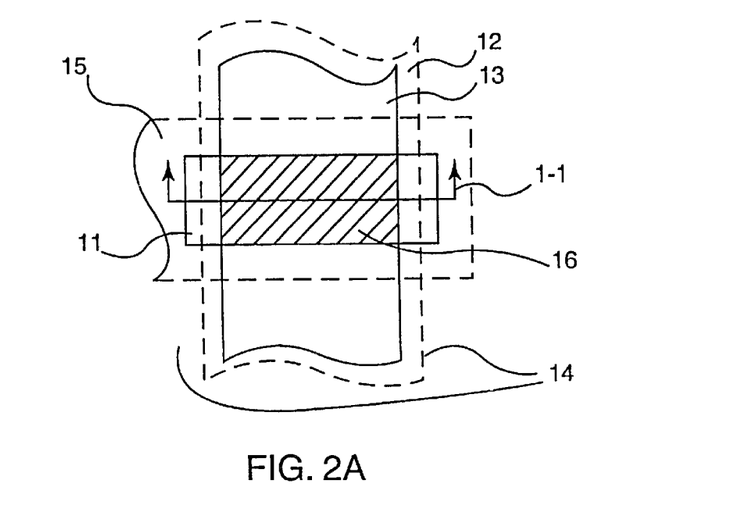
FIG. 2A is a top view of one commonly used EEPROM tunnel window design.
Figure 2B:
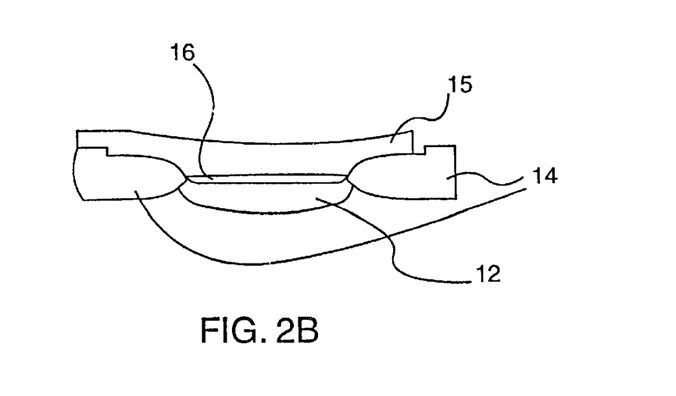
FIG. 2B is a cross-sectional view (A—A) of the EEPROM tunnel window design of FIG. 2A.

A top view of one commonly used tunnel window design is shown in FIG. 2A. The five features defining the tunnel window 16 are represented here by the outlines of photolithographic masks employed during their formation. Reference numbers designate both the mask regions and their respective on-chip features. The five components are an N+ memory diffusion 12, a gate oxide 13, a field oxide 14, a tunnel oxide mask 11, and a polysilicon floating gate 15. In this design, a tunnel oxide is grown in the region defined by the tunnel oxide mask 11 over the memory diffusion (MD) 12. The polysilicon floating gate 15 covers all of the tunnel oxide region. The tunnel window 16 is defined by that portion of the tunnel oxide mask 11 lying beyond the field oxide 14 and intersecting the memory diffusion (MD) 12. The tunnel window 16 is therefore bordered by field oxide 14 on two opposing sides. As noted above, the stresses in the tunnel oxide at the field oxide boundary areas can produce defects which may be detrimental to EEPROM function. As further noted above, these defects are increasingly likely with this design as device sizes decrease since smaller tunnel windows require more closely spaced field oxide regions. FIG. 2B shows a cross section A—A of FIG. 2A.

Figure 2C:
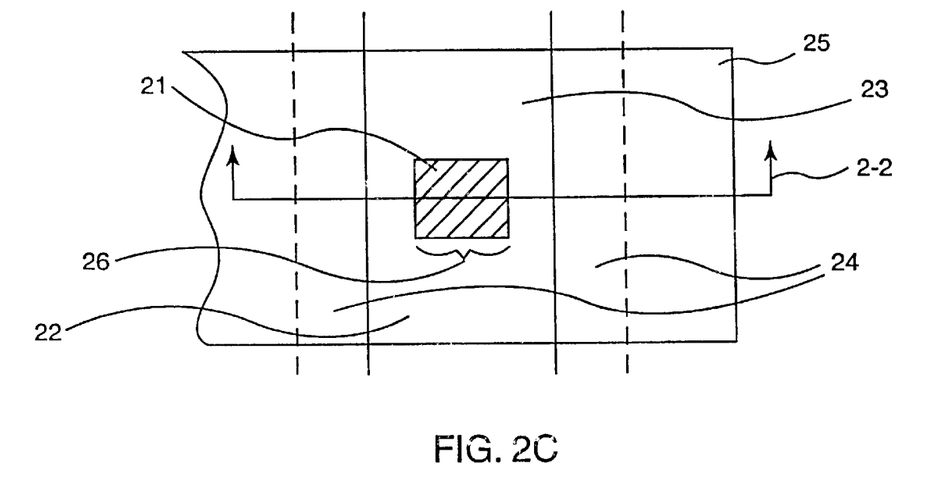
FIG. 2C is a top view of another commonly used EEPROM tunnel window design.
Figure 2D:
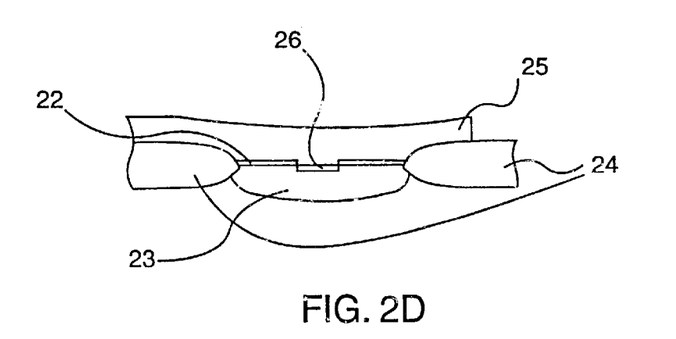
FIG. 2D is a cross-sectional view (B—B) of the EEPROM tunnel window design of FIG. 2C.

A top view of another commonly used tunnel window design is shown in FIG. 2C. Again, the features defining the tunnel window 26 are represented in part by the outlines of photolithographic masks employed during their formation, with the reference numbers designating both the mask regions and their respective on-chip features. In this design, a tunnel oxide 21 is grown within a region of gate oxide 22, over a memory diffusion (MD) 23, but removed from the edges of a field oxide 24. A polysilicon floating gate 25 covers the entire tunnel oxide region and a large part of the surrounding area. In this design, the tunnel window 26 is determined by the size of the hole in the tunnel oxide mask (the mask applied prior to etching the gate oxide in preparation for the growth of the tunnel oxide). Therefore the tunnel oxide is entirely coincident with the tunnel window, which separates the MD 23, below, and floating gate 25, above. FIG. 2D shows a cross section B—B of FIG. 2C.

While this design avoids the problems associated with tunnel oxide defects caused at the field oxide edges, it presents similar scaling problems since it becomes increasingly difficult to define and etch smaller square openings for the tunnel oxide mask. This design approach suffers from the additional problem that it produces a large overlap of polysilicon floating gate and MD separated by gate (or MD) oxide. The result is that there is a relatively high gate capacitance at the tunnel oxide node of the EEPROM. This gate capacitance will degrade the performance of the cell.

Thus, there is a need for an improved tunnel window design which does not have an unacceptably high capacitance and which can scale to smaller device sizes without introducing unacceptable defects in active portions of the tunnel oxide.

SUMMARY OF THE INVENTION

The present invention provides an EEPROM device, and a method of making such a device, which incorporates a tunnel window having acceptably low gate capacitance at the tunnel oxide node, and which avoids the defects caused by field oxide induced stresses in the tunnel oxide.

The EEPROM of the present invention includes a semiconductor substrate with a doped memory diffusion region serving as an electrical connection under the floating gate. Overlying at least a portion of the memory diffusion is a tunnel oxide. Overlying at least a portion of the tunnel oxide is a floating gate extension. The tunnel window of the EEPROM of the present invention is self-aligned, being defined within at least a portion of the tunnel oxide overlying the memory diffusion and having at least two edges defined by the floating gate extension, so that when a defined voltage is applied to the memory diffusion a tunnel current sufficient to change the state (on/off) of the EEPROM flows between the memory diffusion and the floating gate structure.

The invention further provides a method of forming an EEPROM, including forming a doped memory diffusion region in a semiconductor substrate, and forming a tunnel oxide on the substrate overlying at least a portion of the memory diffusion. A floating gate structure including an extension overlying at least a portion of the tunnel oxide overlying the memory diffusion and having at least two edges defined by the floating gate extension is then formed. When a defined voltage is applied to the memory diffusion a tunnel current sufficient to change the state of the EEPROM flows between the memory diffusion and the floating gate structure.

In a preferred embodiment of the present invention, the tunnel window is substantially separated from the field oxide-induced stress region.

Among the advantages of the present invention is that the tunnel oxide and polysilicon masks can be precisely scaled to produce smaller tunnel windows for future applications without encountering the field oxide area defects or the capacitance problems of the prior art designs.

These and other features and advantages of the invention will be described in more detail below with reference to the drawings.

DETAILED DESCRIPTION OF THE PREFERRED EMBODIMENTS

The present invention will be described in terms of a preferred embodiment. It will be understood by those skilled in the art that variations of the described method and apparatus may be made without departing from the scope of the present invention.

Figure 3:
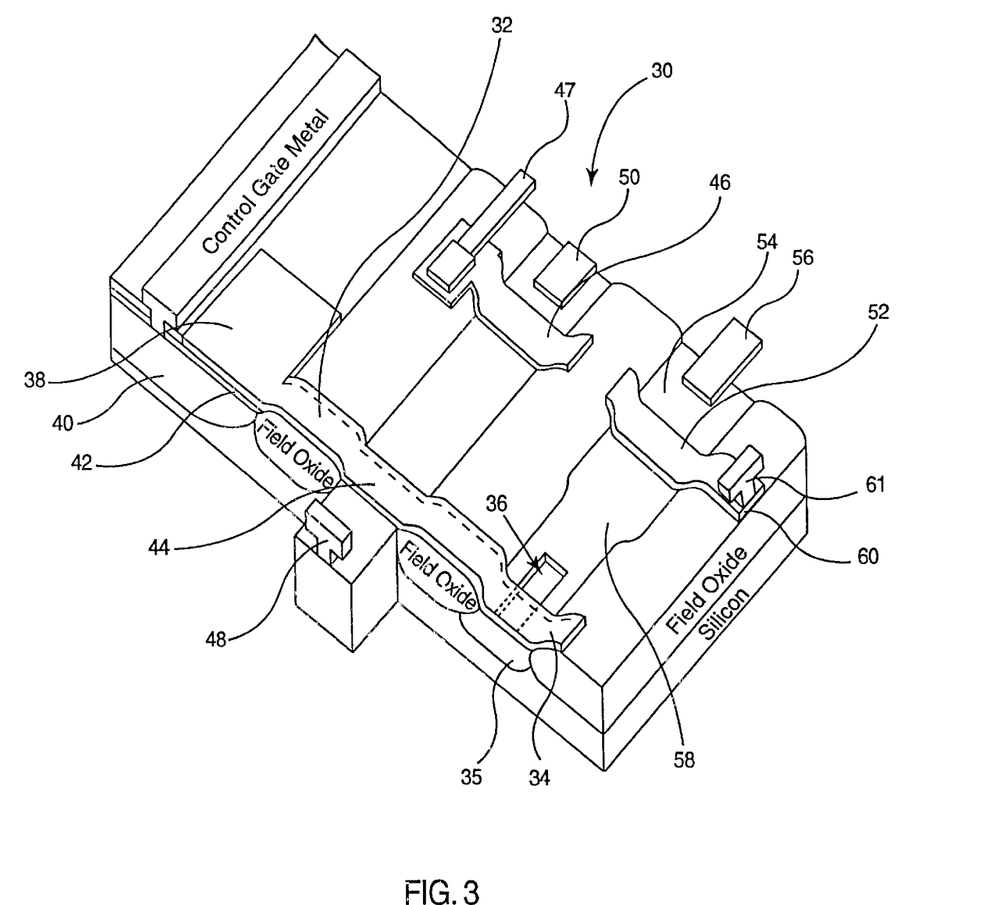
FIG. 3 is a cross-sectional perspective view of a preferred embodiment of the present invention, a single polysilicon EEPROM cell.

In a preferred embodiment illustrated in FIG. 3, a single polysilicon EEPROM cell 30 is shown. The cell includes a single polysilicon floating gate structure 32 which performs three functions. At a first end, a tunnel extension 34 of floating gate 32 acts as an electrode in the two terminal device used for tunneling electrons from a heavily doped $N^+$ implant 35 (also referred to as a Memory Diffusion or MD) through a tunnel oxide 36 (often about 80 Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor.

The read transistor is connected in series with a word line transistor having a gate 46 forming part of a word line 47. The read and word line transistors separate a sense amp negative (−) input 48 from a sense amp positive (+) input 50. Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column select line 61 is selected with, for example, 5 volts. The sense amp (−) input 48 can be biased from 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel oxide 36, thereby programming the EEPROM cell 30.

In order to tunnel electrons off floating gate 32, a high voltage must be applied to memory diffusion 35 while ground is applied to second heavily doped N+ implant 40 which underlies and is capacitively coupled to the wide area plate 38. During this process, ground is also applied to sense amp (−) input 48. The application of high voltage to memory diffusion 35 is accomplished through a write column 56 and a write column select transistor 52 including (i) a diffusion region 54 conductively connected to write column 56 for data input, (ii) a source/drain diffusion 58 electrically connected to memory diffusion 35, and (iii) a gate electrode 60 forming part of write column select transistor 61. When a sufficient potential is applied to write column select transistor 61 while a write signal is applied through write column 56, electrons can tunnel off of floating gate 32 to erase the EEPROM cell.

A further description of a typical EEPROM cell and its functional elements is available the publication "EPM7032 Process, Assembly, and Reliability Information Package" available from Altera Corporation of San Jose Calif. That document is incorporated herein by reference for all purposes.

The Process of Fabricating Scalable Tunnel Oxide Windows

FIGS. 4A–D and 5A–E illustrate some of the important steps in the fabrication of a self-aligned scalable tunnel oxide window in accordance with a preferred embodiment of the present invention. It should be understood that numerous variations of this process are permissible and within the scope of this invention. Further, it should be understood that the conditions recited herein are appropriate for devices having feature sizes in the neighborhood of less than about 0.5 μm. The process conditions may have to be modified somewhat for devices in other size regimes, according to design criteria known in the art. In addition, while the invention is mainly intended for use with single polysilicon EEPROM cells, it is also applicable to double polysilicon EEPROM cells and other designs.

Preferably, the method for producing a self-aligned scalable tunnel oxide window in accordance with this invention forms the window over a N+ memory diffusion of an otherwise conventional EEPROM programmable logic device (PLD). The design disclosed improves reliability and performance of PLDs presently available by allowing placement of a tunnel window away from the diffusion edge without detrimentally increasing gate capacitance at the tunnel window node of the EEPROM cell.

Figure 4A:
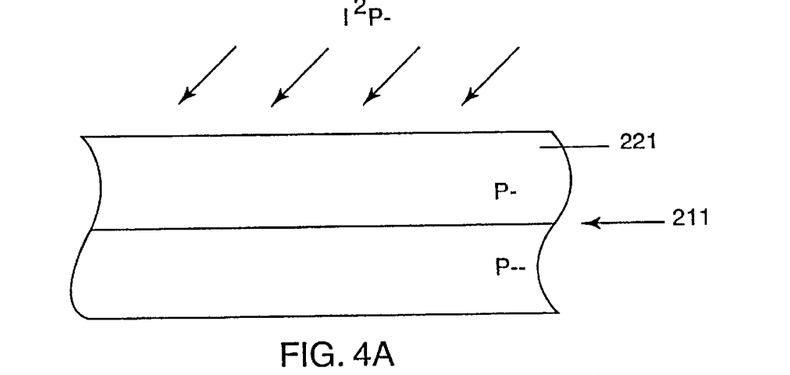
FIGS. 4A–D are cross-sectional side views of stages in the preparation of a substrate for processing according to the present invention.

The semiconductor substrate may be prepared for processing according to the present invention as follows. In FIG. 4A, a p-type ion implant is performed over the substrate 211, penetrating an upper portion of the substrate (the "p-well portion"). The p-type dopant is provided at a dose and energy sufficient to provide a very lightly doped well region 221. For example, this implant might be conducted with boron implanted at about $5\times10^{12}$ to $5\times10^{13}$ cm$^{-2}$ at an energy of between about 35 and 70 keV. A subsequent diffusion anneal may then be conducted at a temperature and for a time sufficient to smooth out the p-type dopant concentration over well region 221 to give a relatively uniform overall light p-doping level. The well formation conditions should be chosen such that the p-well region has a dopant concentration at the substrate surface (i.e., the channel region) of between about $2\times10^{16}$ and $1\times10^{17}$ cm$^{-3}$ (as discussed above). It should be noted that, in many systems, the shape and extent of the p-well is defined by providing the semiconductor material with an ion implant mask of photoresist or other suitable masking material prior to ion implantation. Further alternative embodiments include silicon wafers cut from single crystal silicon grown with a specific dopant concentration, and growing a layer of silicon of the desired bulk concentration epitaxially on top of a heavily doped substrate.

Figure 4B:
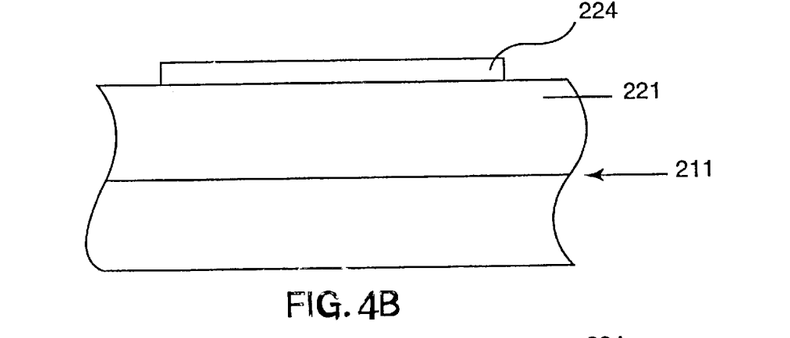
Figure 4C:
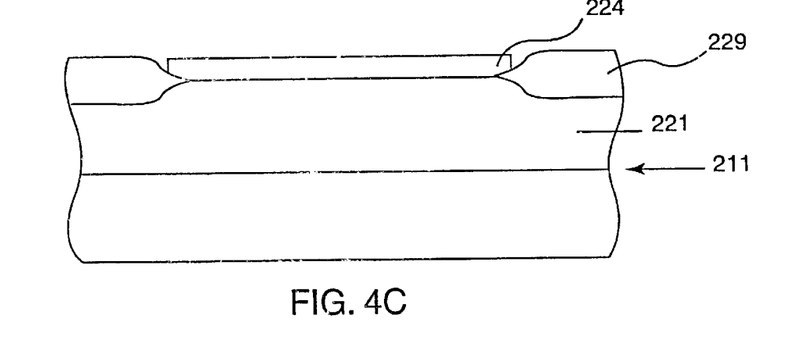
Figure 4D:
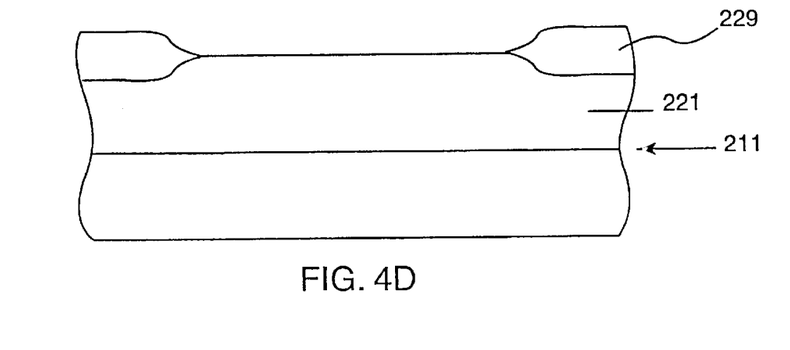

To obtain the structure shown in FIG. 4B, a thick SiN and thin SiO$_2$ stack mask 224 is provided to protect the active areas (i.e., regions where electrodes, tunnel regions, channels, etc. are to be formed). Next, a thick field oxide 229 (preferably of silicon dioxide) is grown at a temperature of between about 900 and 1050° C. to a thickness of between about 0.2 and 0.5 micrometers to produce the structure shown in FIG. 4C. Thereafter, the SiN/SiO$_2$ mask 224 is removed to produce the structure shown in FIG. 4D. The field oxide 229 functions to electrically isolate the various devices and some device elements from one another on the substrate 211. In alternative embodiments, conventional isolation trenches could be used in place of the field oxide to isolate devices on the substrate 211.

Figure 5A:
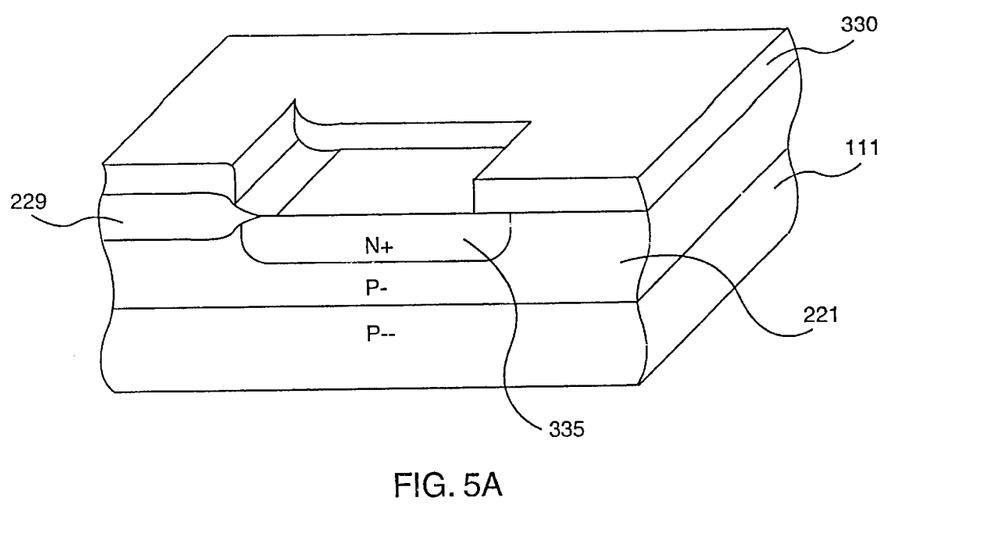
FIGS. 5A–E are cross-sectional perspective views of stages in the making the scalable tunnel oxide windows according to the present invention.

Turning to FIGS. 5A–F, the fabrication of the scalable tunnel oxide windows according to the present invention will be described. As shown in FIG. 5A, after the bare silicon substrate has been exposed following the field oxide growing step, another photoresist mask 330 is provided such that an area of the silicon substrate surface bounded by the field oxide 229 is left exposed. Then an n-type ion implant is performed over the substrate 211, penetrating the substrate's exposed p-well region 221 to create a region underlying the substrate surface that has an n-type conductivity (the "memory diffusion" or "MD" region 335). For example, the n-type dopants phosphorus and arsenic may be provided at doses of between about $1\times10^{14}$ to $1\times10^{15}$ and $7\times10^{14}$ to $7\times10^{15}$, respectively, at an energy of about 80 to 120 keV and 60 to 80 keV, respectively, which is sufficient to provide a highly doped MD region 335. This implant produces an n-type dopant concentration of about $1\times10^{18}$ to $1\times10^{20}$ cm$^{-3}$ in an MD region about 0.4 and 0.8 μm deep immediately under the substrate surface (an area which will act as tunnel oxide connection under the polysilicon floating gate in the completed device—e.g., MD 35 in FIG. 3). Following this n-type ion implant step, the photoresist is removed.

At this stage, threshold voltage adjustment implants (not shown) may be performed on the device substrate in order to set appropriate transistor threshold voltages. In a preferred embodiment, the implant is conducted with Boron (B) ions at a dose of between about $1\times10^{12}$ and $6\times10^{12}$ and an energy of between about 20 and 40 keV. Methods for generating these implants are well known in the art.

Figure 5B:
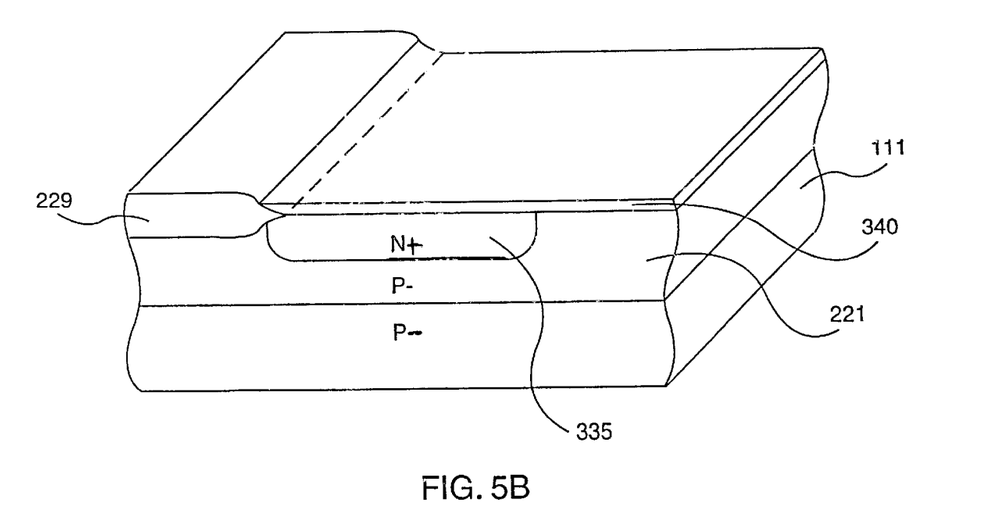

Next, as shown in FIG. 5B, a thin gate oxide 340 is grown on the bare silicon surface in an oxygen-containing atmosphere at a temperature of between about 800 and 950° C. for about 6 to 10 minutes to produce a thickness of between about 145 and 190 Å over the MD region 335. Because the gate oxide grows more quickly over the highly doped MD region 335 than the well 221, the thickness of the gate oxide outside of the MD 335 will be slightly less, about 125 to 170 Å. Typically, the gate oxide 340 will be a single layer of silicon dioxide, but it may also be a multi-layer structure including, for instance, silicon nitride. (Technically, such multi-layer structures should be referred to as "gate dielectrics" rather than merely "gate oxides").

Figure 5C:
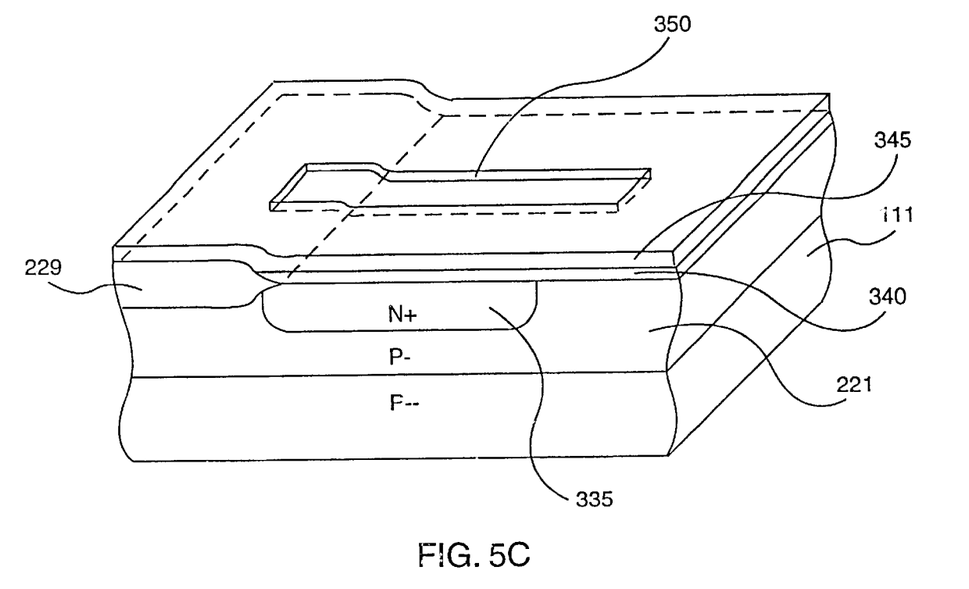

As shown in FIG. 5C, after the gate oxide or gate dielectric has been formed, a photoresist mask 345 is applied, leaving only a slot 350 whose width is selected to be a first dimension of the desired tunnel oxide window. In one embodiment, this slot may have the following range of dimensions: width, about 0.25 to 0.5 μm by length, about 0.75 to 1.5 μm. After the mask 345 is formed, the gate oxide exposed in the slot area 350 is removed, for instance, with a wet SiO$_2$ etch using 1% HF or 10:1 buffered HF solution. The wet etch will generally make the final window dimension about 0.05 to 0.1 μm per side larger than the mask 345 dimensions.

The exposed silicon surface should be as smooth as possible. Additional surface smoothening may be conducted by further oxidation and/or by other processing methods known in the art, such as RCA cleans.

Figure 5D:
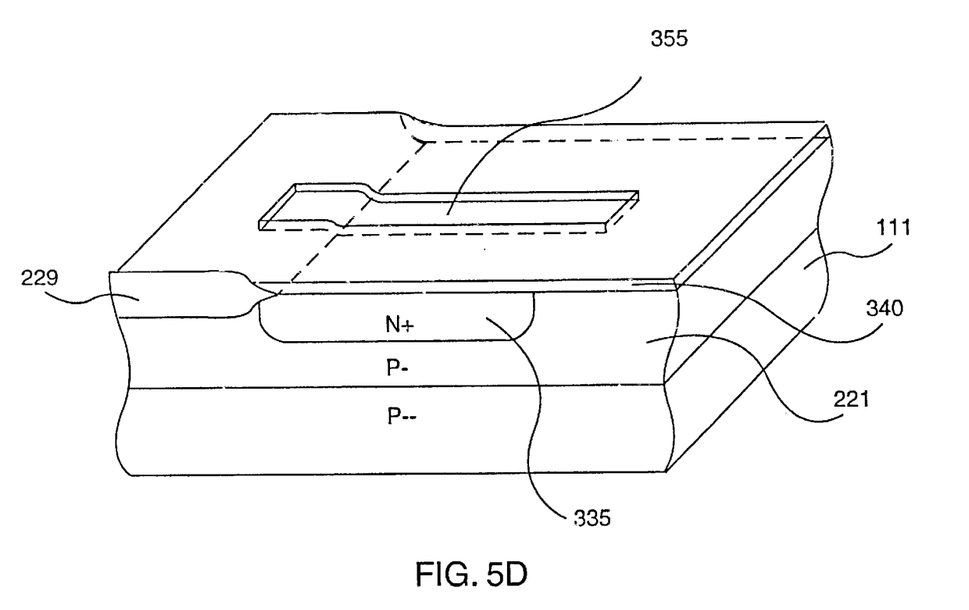
Figure 5E:
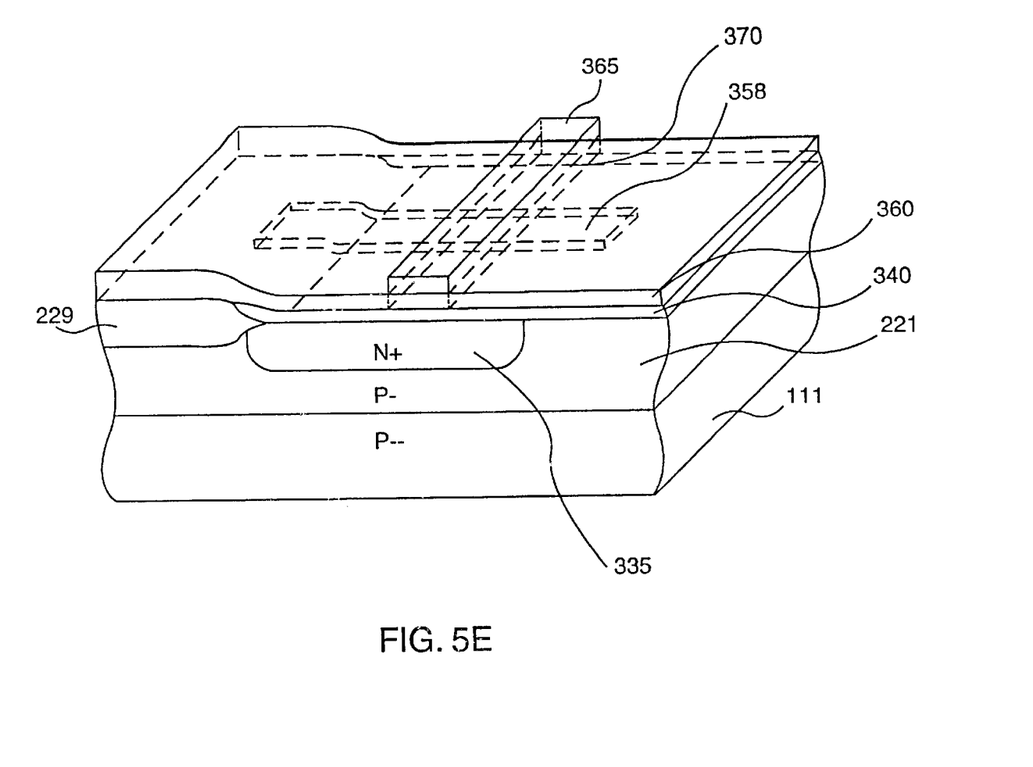

The structure of FIG. 5D is produced by removing the photoresist used during the most recent etch step. This leaves a region of bare silicon 355 within the gate oxide region 340 on substrate 211 overlying at least a portion of the MD 335. Note that the region 355 may extend into the field oxide region 229. Then, as shown in FIG. 5E, a tunnel oxide layer 358 is grown over the slot of bare silicon surface 355 created by the etch. A tunnel oxide 358 is generated by thermal oxidation at 850 to 950° C. for about 7 minutes in a dry $O_2$/Cl atmosphere so that the bare silicon surface in the slot 355 is converted to an oxide layer of about 70 to 100 Å in thickness. This thermal oxidation will further increase the thickness of the gate oxide layer to about 160 to 200 Å over the MD region 335, and 145 to 190 Å over the well 221.

Next, in order to form the floating gate, a blanket of polysilicon 360 approximately 1000 to 2000 Å in thickness is deposited over the device surface by, for example, chemical vapor deposition. The polysilicon layer may be followed by a silicide (e.g., $WSi_2$) layer (not shown) of about 1000 to 2000 Å.

To produce the structure of FIG. 5E, a strip of photoresist mask 365 is formed on the surface of polysilicon (or polysilicon/silicide) layer 360 and oriented 90 degrees from the longer axis of the tunnel oxide slot 355. The mask 365 defines two edges of the desired tunnel oxide window (with the other edges being defined by the tunnel oxide mask). Once the mask 365 is in place, an etch is used to remove the unmasked polysilicon while minimizing damage to the tunnel window edge. Since charging and tunnel oxide removal along the polysilicon edge may degrade the tunnel oxide reliability and endurance, the etch should be highly selective to polysilicon over $SiO_2$, approximately 20–100:1, so as to minimize the amount of tunnel oxide removed from along the edges of the polysilicon. The etch should also minimize the charge on the polysilicon after the floating gates are isolated during the etch. An example of a suitable etch is a reactive ion etch (RIE) using $SF_6/Cl_2$. Once the mask 365 is removed, a strip of polysilicon (or polysilicon/silicide) 370 (the floating gate extension) intersecting the tunnel oxide 358 remains.

Figure 6:
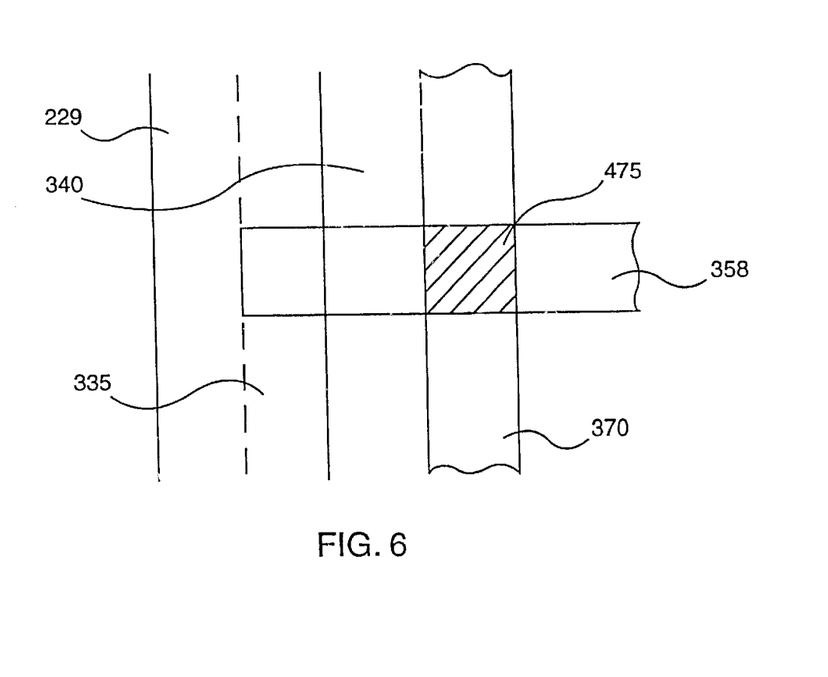
FIG. 6 is a top view of a scalable tunnel oxide window according to the present invention.

As shown in FIG. 6, a tunnel window 475 is defined by the intersection of the tunnel oxide 358 and the polysilicon floating gate extension 370. As such, the tunnel window is self-aligned with the polysilicon strip 370 thereby facilitating its precise placement over the memory diffusion and its precise scaling. Among the advantages of this design are that no edge of the tunnel window is defined by field oxide. Any field oxide stress region-associated defects in the tunnel window are thereby avoided. Also, the difficulty of cutting small scale tunnel oxide "holes" in a gate oxide region is not faced. Further, the design does not result in excessive MD/gate oxide/floating gate capacitance.

Figure 7A:
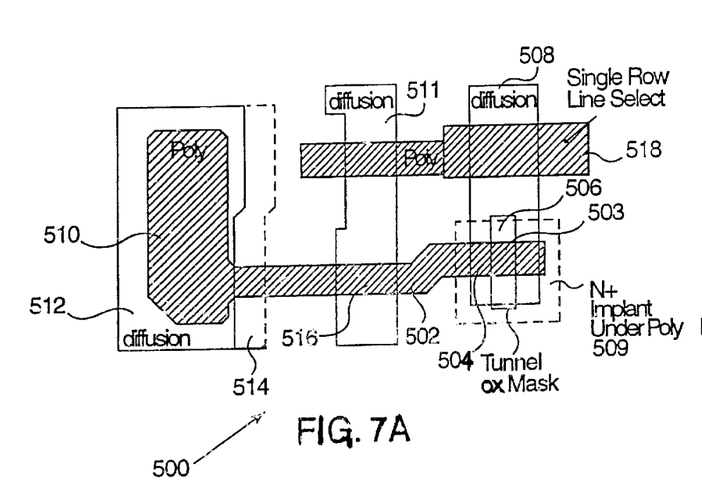
FIGS. 7A–D are top views of representative EEPROM implementations of the tunnel oxide window of the present invention
Figure 7B:
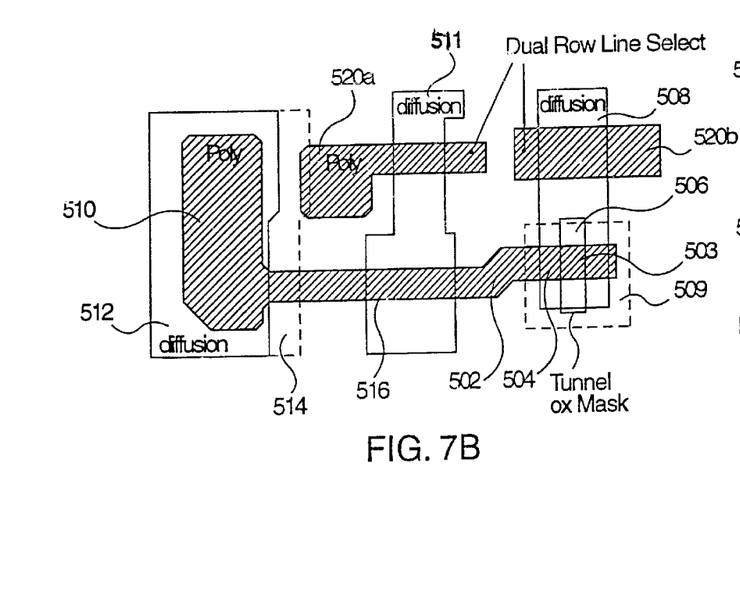

FIGS. 7A–D show cell layouts for preferred implementations of the tunnel window design of the present invention. FIG. 7A is a top view of an EEPROM cell 500 having active region diffusions 508, 511 and 512, and having a single layer of polysilicon forming a floating gate 502 straddling all three diffusions. The tunnel window 503 is shown as the intersection of the floating gate extension 504 and a tunnel oxide region 506 overlying a heavily doped memory diffusion 509. At the other end of the floating gate 502, a wide area plate 510 is employed as one electrode of a capacitor enabling the floating gate 502 to be raised to a high voltage (about 6.5 to 10.5 volts) by capacitively coupling from a second electrode 512 (heavily doped N+ silicon) through a gate oxide 514 (often about 200 Å thick). Between these two extremes is a section of polysilicon that forms the gate 516 of a read transistor. This layout also includes a polysilicon single row-line select 518 (word line) for controlling read and write operations. FIG. 7B is a top view of a second single poly EEPROM layout having the same elements as FIG. 7A, but with a dual row-line select 520a and 520b, rather than a single. This dual row-line select 520a and 520b allows independent control of the read operation (520a) and the write operation (520b).

Figure 7C:
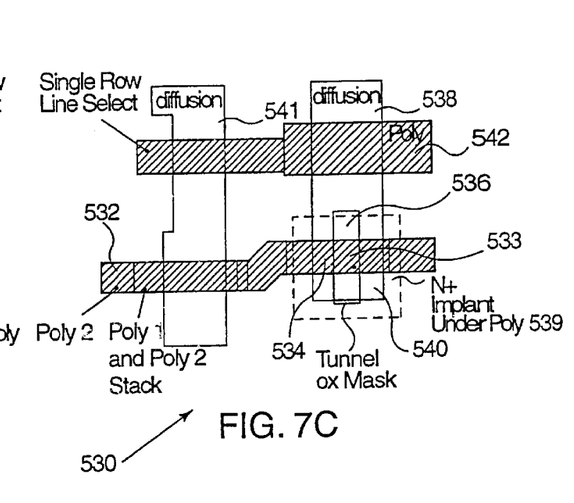
Figure 7D:
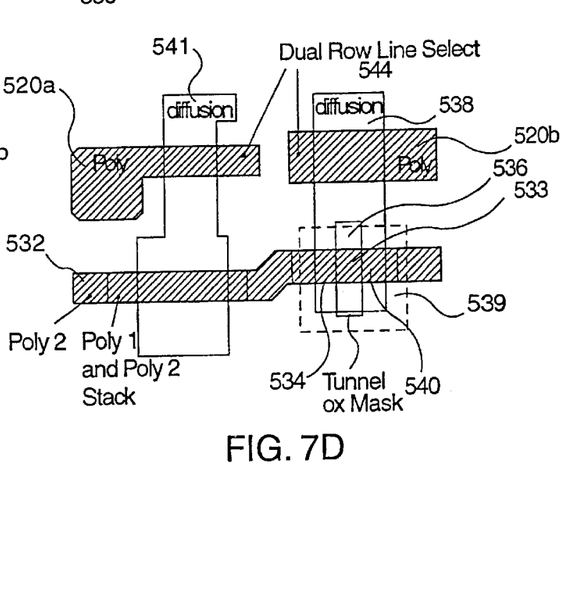

FIG. 7C is a top view of an EEPROM cell 530 having a double layer polysilicon stack 532 which includes a floating gate (lower layer) and a control gate 540 (upper layer). Double layer polysilicon stack 532 straddles diffusions 538 and 541 as shown. The tunnel window 533 is again shown as the intersection of a floating gate extension 534 and a tunnel oxide region 536 overlying a heavily doped memory diffusion 539. This layout also includes a polysilicon single row-line select 542 as in the embodiment of FIG. 7A. FIG. 7D is a top view of a second double poly EEPROM layout having the same elements as FIG. 7C, but with a dual row-line select 544, rather than a single. This dual row-line select 544 is analogous to dual row-line select 520a and 520b in FIG. 7B.

Note that all four layouts use separate transistors for the read and write (program) paths. This allows for the read current to be high without affecting the programming function of the cell.

Although a specific embodiment of the present invention has been described in detail, it should be understood that the present invention may be embodied in many other specific forms without departing from the spirit or scope of the invention as recited in the claims. For example, other suitable materials, well known in the art, may be substituted for the substrate, oxides and floating gate materials used in the described embodiment.

What is claimed is:

1. An EEROM comprising:
   (a) a semiconductor substrate having a surface:
   (b) a doped memory diffusion region in the semiconductor substrate;
   (c) a tunnel oxide on said substrate surface and overlying at least a portion of said memory diffusion;
   (d) a floating gate structure including an extension overlying at least a portion of the tunnel oxide overlying said memory diffusion;
   (e) one or more field oxide regions adjacent to said tunnel oxide; and
   (f) a tunnel window defined within the tunnel oxide and separated from said one or more field oxide regions, said tunnel window defined by the middle of the intersection of the floating gate extension and the tunnel oxide and having two edges defined by the floating gate extension, and two edges redefined by the tunnel oxide, and whereby when a defined voltage is applied to said memory diffusion a tunnel current sufficient to change the state of said EEPROM flows between said memory diffusion and said floating gate structure.

2. The EEPROM of claim 1, further comprising a gate oxide located between said one or more field oxide regions and said tunnel window.

3. The EEPROM of claim 1, wherein the floating gate extension and the tunnel oxide are both rectangular shaped.

4. The EEPROM of claim 1, wherein said memory diffusion is n-doped.

5. An EEPROM comprising:

(a) a semiconductor substrate having a surface;

(b) a n-doped memory diffusion region in the semiconductor substrate;

(c) a tunnel oxide on said substrate surface, surrounded by an area of gate oxide, and overlying at least a portion of said memory diffusion;

(d) a floating gate structure including an extension overlying at least a portion of the tunnel oxide overlying said memory diffusion;

(e) one or more field oxide regions adjacent to said tunnel oxide;

(f) a write column electrically connected with a write transistor having as one source/drain region said memory diffusion;

(g) a read transistor having as its gate electrode said floating gate; and (h) a tunnel window separated from said one or more field oxide regions, said tunnel window defined by the intersection of the floating gate extension and the tunnel oxide wherein said tunnel window has two edges defined by the floating gate extension, and two edges redefined by the tunnel oxide, whereby when a defined voltage is applied to said memory diffusion through said write column a tunnel current sufficient to change the state of said EEPROM flows between said memory diffusion and said floating gate structure and may be read through said read transistor.

* * * * *